United States Patent
Chu-Kung et al.

(10) Patent No.: US 10,644,111 B2
(45) Date of Patent: May 5, 2020

(54) STRAINED SILICON LAYER WITH RELAXED UNDERLAYER

(71) Applicant: Intel Corporation, Santa Clara, CA (US)

(72) Inventors: Benjamin Chu-Kung, Hillsboro, OR (US); Van H. Le, Beaverton, OR (US); Ashish Agrawal, Hillsboro, OR (US); Jack T. Kavalieros, Portland, OR (US); Matthew V. Metz, Portland, OR (US); Seung Hoon Sung, Portland, OR (US); Rafael Rios, Austin, TX (US); Gilbert Dewey, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/325,420

(22) PCT Filed: Sep. 30, 2016

(86) PCT No.: PCT/US2016/054882
§ 371 (c)(1),
(2) Date: Feb. 14, 2019

(87) PCT Pub. No.: WO2018/063360
PCT Pub. Date: Apr. 5, 2018

(65) Prior Publication Data
US 2019/0214466 A1    Jul. 11, 2019

(51) Int. Cl.
*H01L 21/8234* (2006.01)
*H01L 29/10* (2006.01)
(Continued)

(52) U.S. Cl.
CPC .......... *H01L 29/1054* (2013.01); *H01L 21/02* (2013.01); *H01L 21/0243* (2013.01);
(Continued)

(58) Field of Classification Search
CPC .. H01L 21/02518; H01L 21/461; H01L 21/70
See application file for complete search history.

(56) References Cited

U.S. PATENT DOCUMENTS 9,419,079 B1    8/2016    Reznicek
2004/0262687 A1  12/2004   Jung et al.
(Continued)

FOREIGN PATENT DOCUMENTS

KR    20050001165 A    1/2005
WO    2016105404 A1    6/2016

OTHER PUBLICATIONS

The International Searching Authority, Written Opinion of the International Searching Authority and the International Search Report dated Jun. 29, 2017 in International Application No. PCT/US2016/054882, 11 pages.
(Continued)

*Primary Examiner* — Cheung Lee
(74) *Attorney, Agent, or Firm* — Trop, Pruner & Hu, P.C.

(57) ABSTRACT

An embodiment includes a device comprising: a substrate; a dielectric layer on the substrate and including a trench; a first portion of the trench including a first material that comprises at least one of a group III-V material and a group IV material; and a second portion of the trench, located between the first portion and the substrate, which includes a second material and an upper region and a lower region; wherein: (a)(i) the second material in the upper region has fewer defects than the second material in the lower region, and (a)(ii) the first material is strained. Other embodiments are described herein.

22 Claims, 5 Drawing Sheets

(51) Int. Cl.
*H01L 21/02* (2006.01)
*H01L 29/66* (2006.01)
*H01L 29/32* (2006.01)
*H01L 29/78* (2006.01)
*H01L 21/768* (2006.01)
*H01L 27/088* (2006.01)
*H01L 29/165* (2006.01)
*H01L 29/267* (2006.01)

(52) U.S. Cl.
CPC .... *H01L 21/0245* (2013.01); *H01L 21/02381* (2013.01); *H01L 21/02502* (2013.01); *H01L 21/02532* (2013.01); *H01L 21/02538* (2013.01); *H01L 21/02639* (2013.01); *H01L 21/768* (2013.01); *H01L 21/823412* (2013.01); *H01L 27/088* (2013.01); *H01L 29/165* (2013.01); *H01L 29/267* (2013.01); *H01L 29/32* (2013.01); *H01L 29/66795* (2013.01); *H01L 29/785* (2013.01); *H01L 29/7851* (2013.01); *H01L 21/02463* (2013.01); *H01L 21/02466* (2013.01)

(56) References Cited

U.S. PATENT DOCUMENTS

| | | |
|---|---|---|
| 2010/0078682 A1 | 4/2010 | Ngai et al. |
| 2015/0108543 A1 | 4/2015 | Xiao |
| 2016/0233206 A1 | 8/2016 | Morrow et al. |
| 2017/0323962 A1 | 11/2017 | Dewey et al. |

OTHER PUBLICATIONS

Van De Walle, "Effects of impurities on the lattice parameters of GaN", Physical Review B, Oct. 29, 2003, pp. 165209-1 to 165209-5, vol. 68, Issue 16, The American Physical Society.

"Basic Parameters of Silicon Germanium (SiGe)", 5 pages, http://www.ioffe.ru/SVA/NSM/Semicond/SiGe/basic.html, accessed Sep. 8, 2016.

"Basic Parameters of Germanium (Ge)", 1 page, http://www.ioffe.ru/SVA/NSM/Semicond/Ge/basic.html, accessed Sep. 8, 2016.

"Basic Parameters of Silicon (Si)", 1 page, http://www.ioffe.ru/SVA/NSM/Semicond/Si/basic.html, accessed Sep. 8, 2016.

STRAINED SILICON LAYER WITH RELAXED UNDERLAYER

TECHNICAL FIELD

An embodiment addresses lattice mismatched semiconductor devices.

BACKGROUND

A variety of electronic and optoelectronic devices can be enabled by developing, for example, high quality III-V semiconductors on elemental silicon (Si) substrates or IV semiconductors on Si substrates. Surface layers capable of achieving the performance advantages of III-V or IV materials may host a variety of high performance electronic devices such as CMOS and quantum well (QW) transistors fabricated from extremely high mobility materials such as, but not limited to, indium antimonide (InSb), indium arsenide (InAs), germanium (Ge), and silicon germanium (SiGe). Optical devices, such as lasers, detectors and photovoltaics, as well as electronic devices may be fabricated from various other direct band gap materials, such as, but not limited to, gallium arsenide (GaAs) and indium gallium arsenide (InGaAs).

The growth of III-V and IV materials upon Si substrates, however, presents many challenges. Crystal defects are generated by lattice mismatch, polar-on-nonpolar mismatch, and thermal mismatch between the III-V semiconductor epitaxial (EPI) layer and the Si semiconductor substrate or the IV semiconductor EPI layer and the Si semiconductor substrate. When the lattice mismatch between the EPI layer and substrate exceeds a few percent, the strain induced by the mismatch becomes too large and defects are generated in the EPI layer. Once the film thickness is greater than the critical thickness (i.e., film is fully strained below this thickness and partially relaxed above this thickness), the strain is relaxed by creating misfit dislocations at the film and substrate interface as well as in the EPI film. The EPI crystal defects may be in the form of threading dislocations, stacking faults and twins. Many defects, particularly threading dislocations and twins, tend to propagate into the "device layer" where the semiconductor device is fabricated. Generally, the severity of defect generation correlates to the amount of lattice mismatch between the III-V semiconductor and the Si substrate or the IV semiconductor and the Si substrate.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Figure 1:
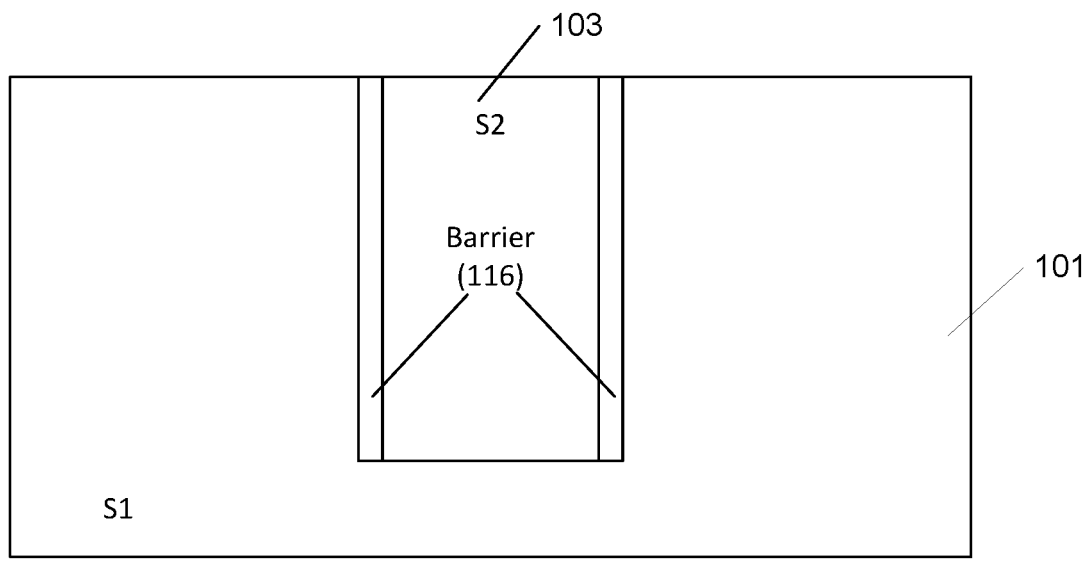
FIG. 1 depicts a conventional trench for aspect ratio trapping.

A conventional technique for managing lattice mismatch, discussed above, includes Aspect Ratio Trapping (ART). ART is based on threading dislocations that propagate upwards at a specific angle. As seen in FIG. 1, in ART a trench is made in a first semiconductor (Si) 101 (or, for example, dielectric) with a high enough aspect ratio (height: width) such that the defects in a second semiconductor (S2) 103 located in the trench terminate on the sidewall of the trench and any layer above the terminations is substantially defect free. The trench may or may not include a barrier 116.

Figure 2:
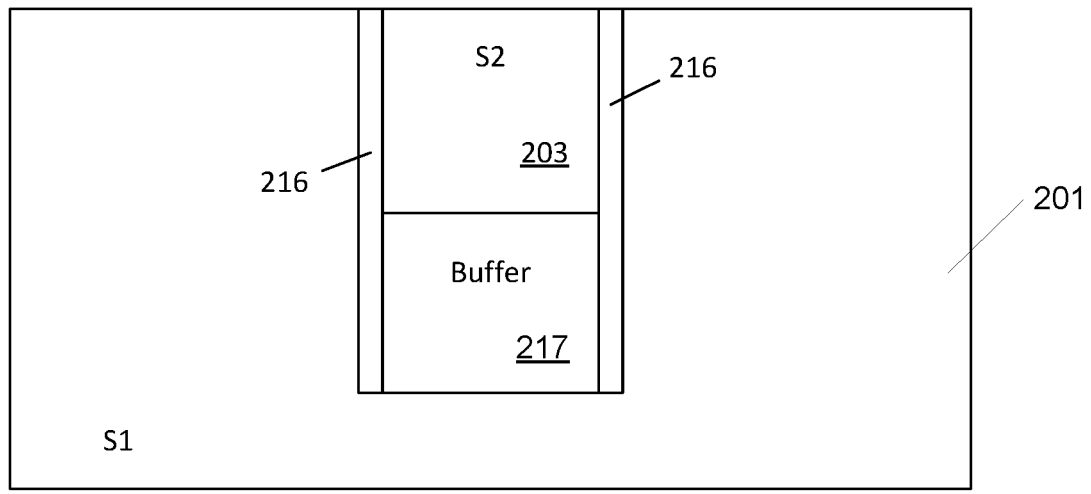
FIG. 2 depicts a conventional buffer layer included in a trench.

As seen in FIG. 2, another conventional technique to manage defects in lattice mismatched configurations involves deposition of a buffer 217 (e.g., which may be 0.5 or more microns thick but may also be thinner than 0.5 microns) that bridges the lattice constant difference between the S1 substrate 201 and the layers of interest (e.g., device layers including III-V materials S2 203 and the like). The buffer may be between barrier portions 216. In such conventional techniques anneals and compositional grading processes are used to "bend" the defects into each other within the thick buffer so the defects annihilate. Many buffer techniques are time consuming, expensive, include undesirable surface roughness of the buffer, and the minimum defect density still remains high.

Embodiments described herein use ART concepts to provide a variety of systems that may be used in, for example, FinFETs. Many of those embodiments do not require a buffer (but some embodiments may still use buffers). A FinFET is a transistor built around a thin strip of semiconductor material (referred to as the "fin"). The transistor includes the standard field effect transistor (FET) nodes/components: a gate, a gate dielectric, a source region, and a drain region. The conductive channel of the device resides on the outer sides of the fin beneath the gate dielectric.

Specifically, current runs along both "sidewalls" of the fin as well as along the top side of the fin. Because the conductive channel essentially resides along the three different outer, planar regions of the fin, such a FinFET is typically referred to as a "tri-gate" FinFET. Other types of FinFETs exist (such as "double-gate" FinFETs in which the conductive channel principally resides only along both sidewalls of the fin and not along the top side of the fin).

For example, some embodiments use ART concepts to provide a substantially unstrained Ge channel area within a trench that also includes a large bandgap material below the channel area (to limit leakage current). Other embodiments focus less on III-V materials and instead focus on locating lattice-strained IV materials, such as Si, within a trench formed above a Si substrate.

More generally, some embodiments address the issue of how to achieve strain in a Si region (e.g., a channel) above a Si substrate but without having defects included in the strained Si. Doing so allows for a strained Si region that can have mobility enhancement for improved devices, such as FinFETs.

An embodiment includes forming a film that is non-lattice matched to Si in the substrate. The non-lattice matched film is in a trench. The film is then relaxed. Since the film is grown in a trench, there will be no (or relatively few) defects propagating to the surface of the film (i.e., the defects are trapped in response to ART). After the film is relaxed, Si is epitaxially grown on top of the relaxed film. The Si will be non-lattice matched to the film and therefore, the Si will be strained.

This addresses a problem identified by Applicant. Namely, there is no way to easily strain Si above a Si substrate without defects. If a non-lattice matched material is grown on Si, that material will be strained to Si. So Si grown on top of this strained layer will be relaxed or unstrained because the underlying layer has substantially taken the lattice constant of the underlying Si substrate.

As will be discussed in further detail with regard to FIG. 3, an embodiment results in strained Si on a Si substrate. A narrow trench is formed. A material non-lattice matched to the Si substrate is formed in the trench. That material is annealed to relax the layer. The resultant defects are trapped at the bottom of the material due to ART. Next, Si is deposited on top of the material and the Si layer is strained to the relaxed material (since the material was relaxed and no longer was strained to the Si substrate).

As will be discussed in further detail with regard to FIG. 4, an embodiment includes growing Ge in a trench, then growing SiGe on the Ge, and then growing additional Ge on the SiGe in the trench. To cause defects at the bottom of the trench in the first Ge layer, the first Ge layer is annealed to relax the Ge layer. Then, as a result of the SiGe being grown on top of first Ge layer, the SiGe was strained to the first Ge layer and the top Ge layer was relatively unstrained (since the SiGe was strained to Ge). This may be confirmed with Raman spectroscopy.

Figure 3:
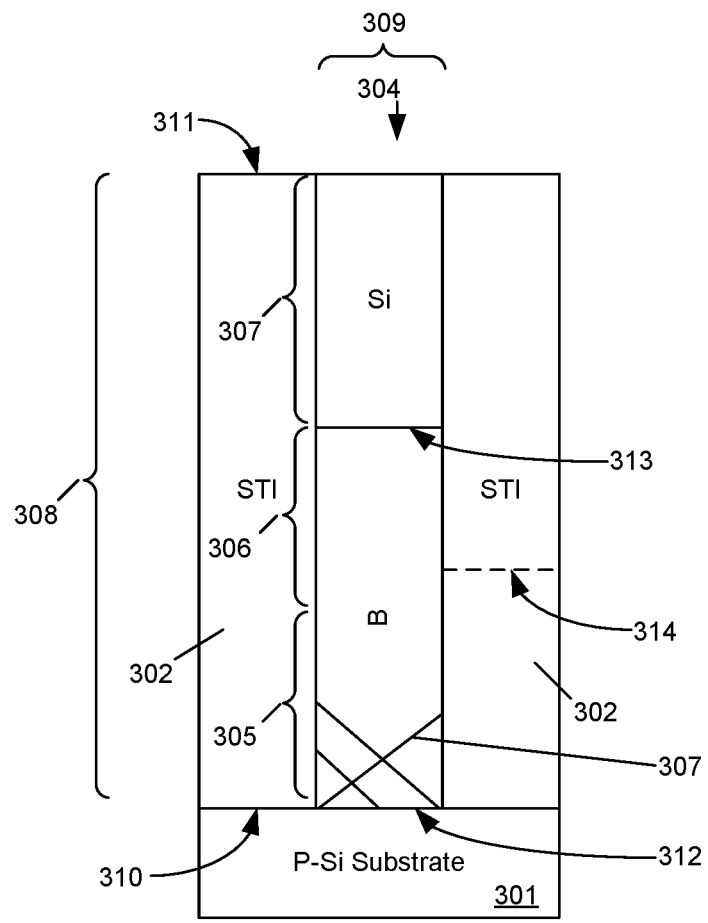
FIG. 3 depicts an embodiment including strained Si in a trench.

FIG. 3 includes an embodiment device 300. Silicon substrate 301 has a bulk substrate lattice constant. Regarding "bulk lattice constant", if a "lattice constant" is a distance between atoms in cubic-cell crystals then a "bulk lattice constant" relates to the material in a bulk state without influence from surrounding layers. In contrast, a "strained lattice constant" relates to distance or spacing that is influenced from surrounding layers/materials and has therefore experienced a shift in the spacing/distance from that of the bulk lattice constant. The change in lattice parameter found in a strained lattice constant with respect to the bulk lattice constant results in strain. Generally accepted values for "bulk lattice constants" are known to those of ordinary skill in the art and are available at locations like, for example, http***//www.ioffe.ru/SVA/NSM/with specific lattice constant information for Si (5.431 A), Ge (5.658 A), $Si_{1-x}Ge_x$ ($5.431+0.20x+0.027x^2$ A), and the like.

Regarding FIG. 3, a dielectric layer 302 is on the substrate. Due to, for example, shallow trench isolation (STI), the dielectric layer includes trench 304. A first portion 307 of the trench includes a first material that comprises at least one of a group III-V material and a group IV material and has a first bulk lattice constant. For example, in FIG. 3 the material is Si. The trench further includes a second portion of the trench which includes a second material having a second bulk lattice constant unequal to the bulk substrate lattice constant. For example, the material may include SiGe (which should be construed to include $Si_{1-x}Ge_x$), InSb, InAs, Ge, GaAs, InGaAs, and the like. The second portion of the trench includes an upper region 306 and a lower region 305 between the upper region and the substrate. The second material is included in both of the upper and lower regions 306, 305. The second material in the upper region 306 has fewer defects 307 than the second material in the lower region 305. The first material of portion 307 is lattice-strained in response to the second bulk lattice constant. In other words, the material of portion 307 is placed under strain due to its bulk lattice constant mismatch with the bulk lattice constant found in the relaxed material of region 306.

Put another way, since the material of area 306 is relaxed and is substantially not lattice-strained with respect to the second material in the lower region 305 then its bulk lattice constant (e.g., the constant for SiGe) would necessarily put strain on the material of portion 307 (e.g., Si, which has a different bulk lattice constant than that of SiGe). As used herein "relaxed" is to be viewed with regard to, for example, a material's bulk lattice constant and, as understood by those of ordinary skill in the art, does not necessarily require 100% relaxation to equal exactly the bulk lattice constant for the material. Thus, the material of area 306 should be relaxed and have a lattice constant relatively close to the bulk lattice constant of the material, at least far closer to the bulk lattice constant than the strained lattice constant found in area 305 before dislocations 307 form to relax the strain.

In FIG. 3 the first material of portion 307 includes a strained first lattice constant such that the spacing/distance between atoms in crystals has changed from that of the bulk lattice constant for that material (i.e., the strained lattice constant for Si in region 307 is unequal to the bulk substrate lattice constant for Si in substrate 301) because the material in area 307 is influenced by the lattice constant of the relaxed material in area 306.

In an embodiment, the strained lattice constant of the material in area 307 is substantially equal to the bulk lattice constant found in the relaxed material of region 306.

While the description above for FIG. 3 largely focuses on Si being in area 307 along with a Si substrate, other embodiments may provide for other material combinations such as, for example, SiGe in area 307 on a semiconductor on insulator (SOI) substrate having a SiGe portion under the fin formed by the trench 304.

In an embodiment, the first material of area 307 directly contacts the second material of area 306. However, in other embodiments there may be barrier or seed layers or the like between the two materials.

In an embodiment the second material of area 305 has a second energy bandgap and the first material of area 307 has a first energy bandgap that is less than the second energy bandgap. This may be needed to control, for example, subfin leakage current. In such a case the dielectric layer 302 has a lower surface 310 between an upper surface 311 of the dielectric layer and the substrate. The second material or area 306 has a lower surface 312 between an upper surface 313 of the second material and the substrate. In such a case, the upper surface of the dielectric layer may be lowered (e.g., etched) to a location 314 that is between the upper surface 313 of the second material and the substrate.

In an embodiment trench 304 has an aspect ratio (depth 308 to width 309) of at least 2:1 but in other embodiments the ratio is 1.3:1, 1.4:1, 1.5:1, 1.6:1, 1.7:1, 1.8:1, 1.9:1, 2.1:1, 2.2:1 and greater.

In an embodiment the first material of area 307 is included within a fin of a FinFET. For example, the material of area 307 may be included in the channel of FinFET. Because the material is strained (e.g., strained Si) the FinFET may have enhanced carrier mobility and the like.

Figure 4:
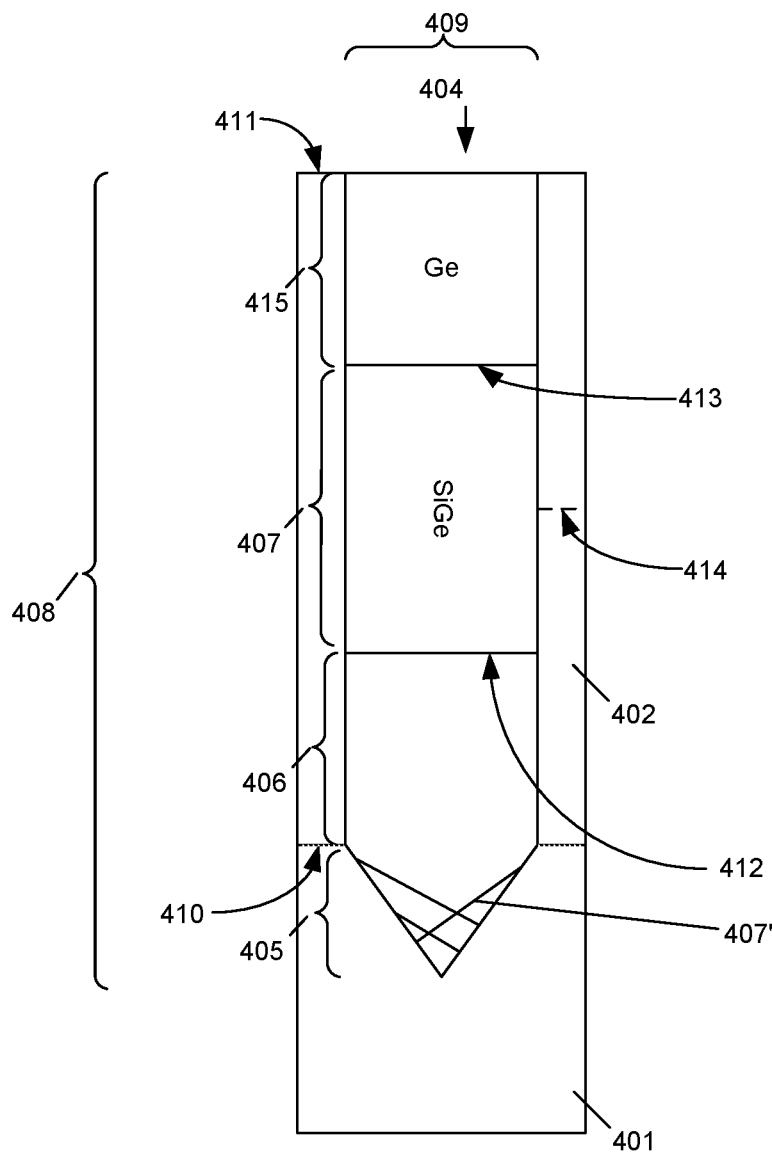
FIG. 4 depicts an embodiment including strained Ge in a trench.

FIG. 4 includes an embodiment device 400. Silicon substrate 401 has a bulk substrate lattice constant. A dielectric layer 402 is on the substrate. Due to, for example, STI, the dielectric layer includes trench 404. A first portion 407 of the trench includes a first material that comprises at least one of a group III-V material and a group IV material and has a first bulk lattice constant. For example, in FIG. 4 the material is SiGe. The trench further includes a second portion of the trench which includes a second material having a second bulk lattice constant unequal to the bulk substrate lattice constant. For example, the material may include Ge (as shown in FIG. 4), InSb, InAs, Ge, GaAs, InGaAs, and the like. The second portion of the trench includes an upper region 406 and a lower region 405 between the upper region and the substrate. The second material is included in both of the upper and lower regions 406, 405. The second material in the upper region 406 has fewer defects 407' than the second material in the lower region 405. The first material of portion 407 is lattice-strained in response to the second bulk lattice constant. In other words, the material of portion 407 is placed under strain due to its bulk lattice constant mismatch with the bulk lattice constant found in the relaxed material of region 406. In an embodiment, the material of layer 407 is grown to a depth or height less than the critical thickness for that material.

In other words, since the material of area 406 is relaxed and is substantially not lattice-strained with respect to the second material in the lower region 405 then its bulk lattice constant (e.g., the constant for Ge) would necessarily put strain on the material of portion 407 (e.g., SiGe, which has a different bulk lattice constant than that of Ge). Thus, the material of area 406 should be relaxed and have a lattice constant relatively close to the bulk lattice constant of the material, at least far closer to bulk lattice constant than the strained lattice constant found in area 405 before dislocations 407' form to relax the strain.

In FIG. 4 the first material of portion 407 includes a strained first lattice constant such that the spacing/distance between atoms in crystals has changed from that of the bulk lattice constant for that material because the material in area 407 is influenced by the lattice constant of the relaxed material in area 406.

In an embodiment, the strained lattice constant of the material in area 407 is substantially equal to the bulk lattice constant found in the relaxed material of region 406 (i.e., the lattice constant of the SiGe is substantially similar to the lattice constant for relaxed Ge in area 406).

While the description above for FIG. 4 largely focuses on SiGe being in area 407 along with a Si substrate, other embodiments may provide for other material combinations such as, for example, InGaAs and the like in area 407 on a SOI substrate having a SiGe portion under the fin formed by the trench 404.

In an embodiment, the first material of area 407 directly contacts the second material of area 406. However, in other embodiments there may be barrier or seed layers or the like between the two materials.

In an embodiment trench 404 has an aspect ratio (depth 408 to width 409) of at least 2:1 but in other embodiments the ratio is 1.3:1, 1.4:1, 1.5:1, 1.6:1, 1.7:1, 1.8:1, 1.9:1, 2.1:1, 2.2:1 and greater.

In an embodiment a third portion 415 of the trench includes a third material that comprises at least one of a group III-V material and a group IV material and has a third bulk lattice constant. For example, in FIG. 4 the material includes Ge. In the example of FIG. 4, the second (area 406/405) and third (area 415) materials each generally have the same chemical composition (e.g., both have Ge).

In an embodiment, the first material of area 407 directly contacts the second material of area 406 and/or the first material of area 407 directly contacts the third material of area 415. However, in other embodiments there may be barrier or seed layers or the like between differing materials.

In an embodiment the third material of area 415 is relaxed and is substantially not lattice-strained. For example, since the material of area 407 is strained to the lattice constant of relaxed material in area 406, and the materials in area 415 and 406 are the same, then the material of area 415 will have little to no mismatch with the strained lattice constant of area 407 (which is strained to the lattice constant of area 406).

In an embodiment, the third material of area 415 has a third energy bandgap and the first material of area 407 has a first energy bandgap that is greater than the third energy bandgap. This may help control subfin leakage current. In such a case, the dielectric layer has a lower surface 410 between an upper surface 411 of the dielectric layer and the substrate. Also, the first material has a lower surface 412 between an upper surface 413 of the first material and the substrate. The upper surface of the dielectric layer 411 is lowered (e.g., etched) between the upper surface 413 of the first material and the substrate to a height such as, for example, height 414.

In other words, when it comes to performing a STI recess, the recess does not need to encompass the boundary between layers (415 and 407 or between 307 and 306) if the top layer (415 or 307) is a wide bandgap material. However, if the top layer is a small bandgap with respect to materials below it, then the boundary layer may need to be lowered in some embodiments to levels 414, 314.

In an embodiment the material of area 415 is included within a fin of a FinFET. For example, the material of area 415 may be included in the channel of a FinFET.

As was the case with the embodiment of FIG. 3, in the embodiment of FIG. 4 the top layer does not have to be Si, Ge, or any material in particular. However, Si at the top layer is of interest due to the difficulty experienced in attempting to strain a Si epitaxial film on a Si substrate. Also, the shape of the bottom of trenches 304, 404 may vary and are not limited to the square or triangular patterns found in FIGS. 3 and 4.

Further, to help distinguish whether a material is strained or non-strained, a person of ordinary skill in the art would understand Raman spectroscopy and/or a transmission electron microscopy (TEM) with strain analysis can be per-formed to determine, for example, there are the two distinct layers in a trench where the bottom layer is relaxed (FIG. 3).

In an embodiment, the channel material (e.g., material of area 307) may be included in an n-type device (e.g., n-FinFET) however in other embodiments the channel may be included in a p-type device (e.g., p-FinFET). Further, areas 307, 415 are not limited to channel areas but may be included in source/drain regions as well in non-transistor areas. In an embodiment, strain is achieved in areas like are 307 without doping.

As a side note, a band gap (also called an energy gap or bandgap) is an energy range in a solid where no electron states can exist. In graphs of the electronic band structure of solids, the band gap generally refers to the energy difference (in electron volts, or eV) between the top of the valence band and the bottom of the conduction band of the material. The band gap energy is equivalent to the energy required to free an outer shell electron from its orbit about the nucleus to become a mobile charge carrier that is able to move freely within the solid material.

A person of ordinary skill in the art will understand "substantially no defects" or "relatively defect free" to not be an absolute term but rather to be a relative term dictated by, for example, resolution of the imaging source (e.g., TEM) used to image the layer. For example, "substantially no defects" may be interpreted as less than 1 part per million (ppm).

In embodiments, dielectric 302, 402 materials include, for example, insulating materials, such as, silicon dioxide ($SiO_2$), silicon oxynitride, silicon nitride, and/or high-k dielectric materials. In general, a high-k dielectric is a dielectric material having a dielectric constant greater than that of $SiO_2$. Exemplary high-k dielectric materials include hafnium dioxide ($HfO_2$), hafnium silicon oxide, lanthanum oxide, lanthanum aluminum oxide, zirconium dioxide ($ZrO_2$), zirconium silicon oxide, titanium dioxide ($TiO_2$), tantalum pentaoxide ($Ta_2O_5$), barium strontium titanium oxide, barium titanium oxide, strontium titanium oxide, yttrium oxide, aluminum oxide, lead scandium tantalum oxide, lead zinc niobate, and other materials known in the semiconductor art.

The base substrate on which a chip is built is typically a silicon wafer, although embodiments of the invention are not dependent on the type of substrate used. The substrate could also be comprised of germanium, indium antimonide, lead telluride, indium arsenide, indium phosphide, gallium arsenide, gallium antimonide, and/or other group III-V materials either alone or in combination with silicon or silicon dioxide or other insulating materials. A substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a SOI substrate. In an embodiment, the semiconductive substrate is a prominent structure such as a fin that extends above a bulk semiconductive material.

Also, "generally equal" or "substantially equal" lattice constants may have lattice constants within 1% of each other. Portions 415, 407, 406 may include "generally equal" lattice constants (bulk lattice constant for areas 415, 406 are generally equal to a strained lattice constant for area 407 in some embodiments).

Figure 5:
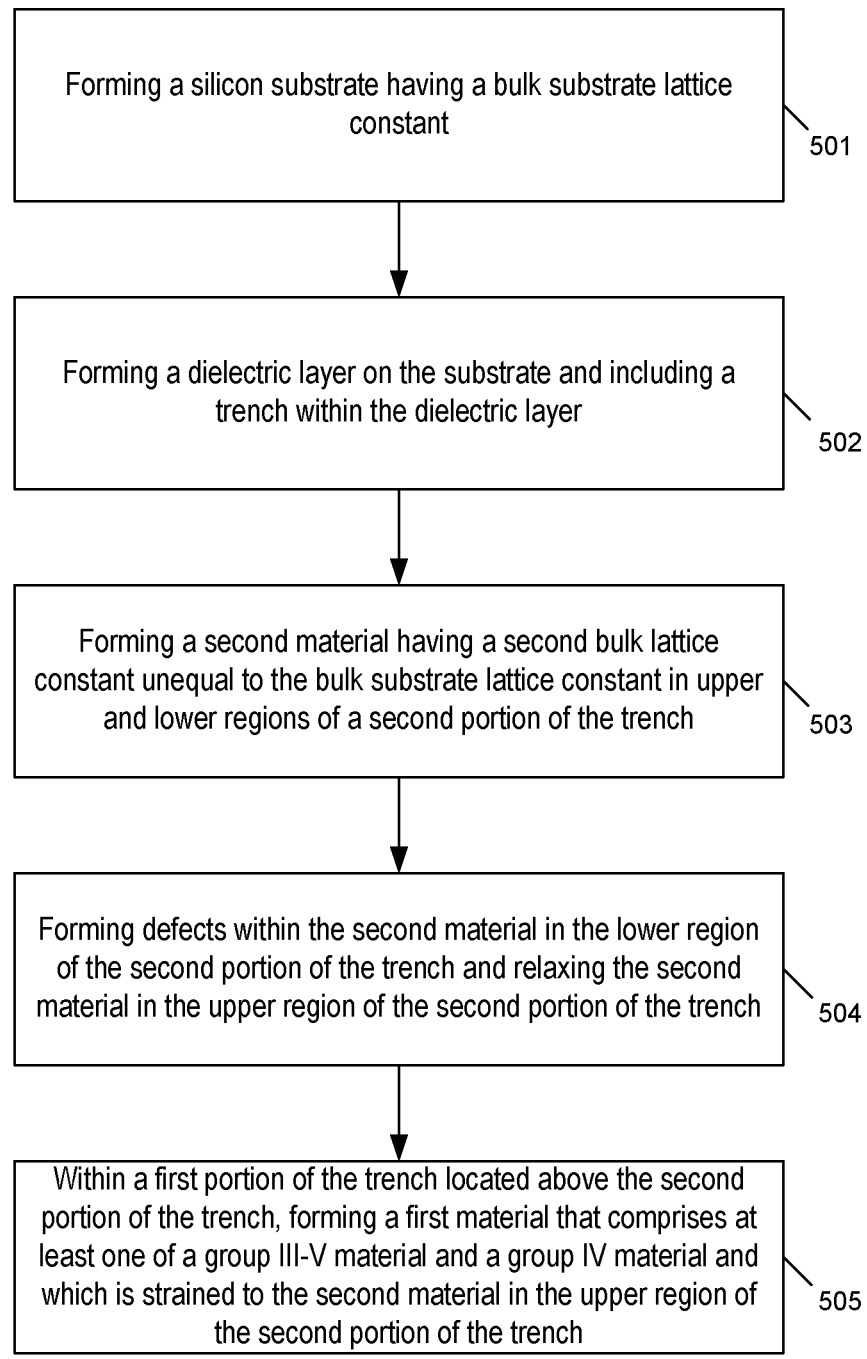
FIG. 5 includes a method in an embodiment.

FIG. 5 includes a method 500 comprising: forming a silicon substrate having a bulk substrate lattice constant (block 501); forming a dielectric layer on the substrate and including a trench (block 502); within a second portion of the trench located between a first portion of the trench and the substrate, forming a second material having a second bulk substrate lattice constant unequal to the bulk substrate lattice constant in upper and lower regions of the second portion (block 503); forming defects within the second material in the lower region and relaxing the second material in the upper region (block 504); within a first portion of the trench, forming a first material that comprises at least one of a group III-V material and a group IV material and has a first bulk lattice constant (block 505) and which is strained to the second material in the upper region of the second portion.

Figure 6:
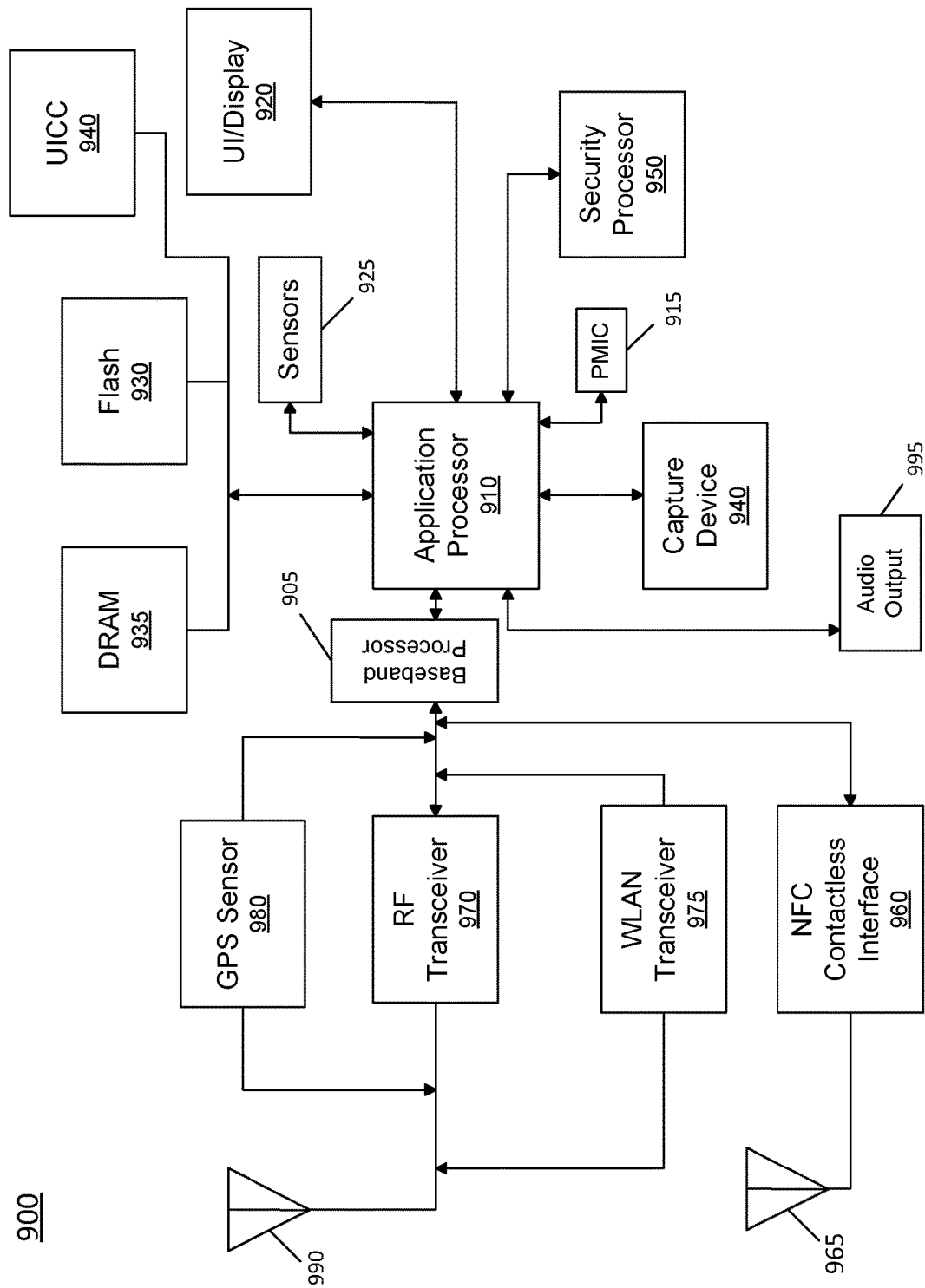
FIG. 6 includes a system that includes an embodiment.

Referring now to FIG. 6, shown is a block diagram of an example system with which embodiments can be used. As seen, system 900 may be a smartphone or other wireless communicator or any other IoT device. A baseband processor 905 is configured to perform various signal processing with regard to communication signals to be transmitted from or received by the system. In turn, baseband processor 905 is coupled to an application processor 910, which may be a main CPU of the system to execute an OS and other system software, in addition to user applications such as many well-known social media and multimedia apps. Application processor 910 may further be configured to perform a variety of other computing operations for the device.

In turn, application processor 910 can couple to a user interface/display 920 (e.g., touch screen display). In addition, application processor 910 may couple to a memory system including a non-volatile memory, namely a flash memory 930 and a system memory, namely a DRAM 935. In some embodiments, flash memory 930 may include a secure portion 932 in which secrets and other sensitive information may be stored. As further seen, application processor 910 also couples to a capture device 945 such as one or more image capture devices that can record video and/or still images.

A universal integrated circuit card (UICC) 940 comprises a subscriber identity module, which in some embodiments includes a secure storage 942 to store secure user information. System 900 may further include a security processor 950 (e.g., Trusted Platform Module (TPM)) that may couple to application processor 910. A plurality of sensors 925, including one or more multi-axis accelerometers may couple to application processor 910 to enable input of a variety of sensed information such as motion and other environmental information. In addition, one or more authentication devices 995 may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more IoT networks, various circuitry may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Embodiments, such as FinFETs including embodiments described herein (e.g., FIGS. 3 and 4) may be included in the above mentioned memories, processors, controllers, transceiver, and the like to thereby lower power consumption and/or increase operation speed for the system of FIG. 6 thereby adding value to the system.

Examples of embodiments follow.

Example 1 includes a device comprising: a silicon substrate having a bulk substrate lattice constant; a dielectric layer on the substrate and including a trench; a first portion of the trench including a first material that comprises at least one of a group III-V material and a group IV material and has a first bulk lattice constant; a second portion of the trench, located between the first portion and the substrate, which includes: (a)(i) a second material having a second bulk lattice constant unequal to the bulk substrate lattice constant, and (a)(ii) an upper region and a lower region between the upper region and the substrate; wherein (b)(i) the second material is included in both of the upper and lower regions, (b)(ii) the second material in the upper region has fewer defects than the second material in the lower region, and (b)(iii) the first material is lattice-strained in response to the second bulk lattice constant.

As used herein, as long as the lattice constant of a first material is different from the lattice constant of a second material directly underlying the first material, the first material is strained.

Example 2 includes the device of example 1 wherein the second material in the upper region is relaxed and is substantially not lattice-strained with respect to the second bulk lattice constant.

Example 3 includes the device of example 2 wherein the trench has an aspect ratio (depth to width) of at least 2:1.

Example 4 includes the device of example 3, wherein the first material is included within a fin of a fin-based field effect transistor (FinFET).

Example 5 includes the device of example 4 wherein: the first material includes a strained first lattice constant in response to the first material being lattice-strained; and the strained first lattice constant is unequal to the bulk substrate lattice constant.

Example 6 includes the device of example 5 wherein the strained first lattice constant is substantially equal to the bulk second lattice constant.

Example 7 includes the device of example 5 wherein the first material includes silicon.

Example 8 includes the device of example 5 wherein the first material directly contacts the second material.

Example 9 includes the device of example 5 wherein the first material is included within a channel of the FinFET.

Example 10 includes the device of example 5 comprising a third portion of the trench including a third material that comprises at least one of a group III-V material and a group IV material and has a third bulk lattice constant; wherein the first portion is between the third portion and the substrate.

Example 11 includes the device of example 10 where in the second and third materials each generally have the same chemical composition.

Example 12 includes the device of example 11 wherein the third material is relaxed and is substantially not lattice-strained.

Example 13 includes the device of example 11 the third material has a third energy bandgap and the first material has a first energy bandgap that is greater than the third energy bandgap.

For example, the band offset between the layers may be >0.3 eV for electrons in the channel and >0.3 eV valence band offset for holes in the channel.

Example 14 includes the device of example 13 wherein: the dielectric layer has a lower surface between an upper surface of the dielectric layer and the substrate; the first material has a lower surface between an upper surface of the first material and the substrate; the upper surface of the dielectric layer is between the upper surface of the first material and the substrate.

Example 15 includes the device of example 5 wherein: the second material has a second energy bandgap and the first material has a first energy bandgap that is less than the second energy bandgap; the dielectric layer has a lower surface between an upper surface of the dielectric layer and the substrate; the second material has a lower surface between an upper surface of the second material and the substrate; the upper surface of the dielectric layer is between the upper surface of the second material and the substrate.

For example, the band offset between the layers may be >0.3 eV for electrons in the channel and >0.3 eV valence band offset for holes in the channel.

Example 19 includes the device of claim 8 wherein the first material is undoped.

Example 20 includes a method comprising: forming a silicon substrate having a bulk substrate lattice constant; forming a dielectric layer on the substrate and including a trench; within a second portion of the trench located between a first portion of the trench and the substrate, forming a second material having a second bulk lattice constant unequal to the bulk substrate lattice constant in upper and lower regions of the second portion; forming defects within the lower region and relaxing the second material in the upper region; within the first portion of the trench, forming a first material that comprises at least one of a group III-V material and a group IV material and has a first bulk lattice constant; wherein (a)(i) the second material in the upper region has fewer defects than the second material in the lower region, and (a)(ii) the first material is strained in response to the second bulk lattice constant.

Example 21 includes the method of claim 20 wherein the first material includes silicon.

Example 22 includes a system comprising: a memory; and a processor coupled to the memory, wherein at least one of the processor and the memory include a transistor according to any one of claims 1 to 19.

Example 1a includes a device comprising: a substrate; a dielectric layer on the substrate and including a trench; a first portion of the trench including a first material that comprises at least one of a group III-V material and a group IV material; and a second portion of the trench, located between the first portion and the substrate, which includes a second material and an upper region and a lower region; wherein: (a)(i) the second material in the upper region has fewer defects than the second material in the lower region, and (a)(ii) the first material is strained.

Example 2a includes the device of claim 1 wherein the second material in the upper region is relaxed.

Example 3a includes the device of claim 2 wherein the first material includes silicon.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A device comprising:
a substrate;
a dielectric layer on the substrate and including a trench;
a first portion of the trench including a first material that comprises at least one of a group III-V material, a group IV material, or combinations thereof; and
a second portion of the trench, located between the first portion and the substrate, which includes a second material and an upper region and a lower region;
wherein: (a)(i) the second material in the upper region has fewer defects than the second material in the lower region, and (a)(ii) the first material is strained.

2. The device of claim 1 wherein the second material in the upper region is relaxed.

3. The device of claim 2 wherein the first material includes silicon.

4. A system comprising:
a memory; and
a processor coupled to the memory,
wherein at least one of the processor and the memory includes a transistor according to claim 1.

5. A device comprising:
a silicon substrate having a bulk substrate lattice constant;
a dielectric layer on the substrate and including a trench;
a first portion of the trench including a first material that comprises at least one of a group III-V material, a group IV material, or combinations thereof and has a first bulk lattice constant;
a second portion of the trench, located between the first portion and the substrate, which includes: (a)(i) a second material having a second bulk lattice constant unequal to the bulk substrate lattice constant, and (a)(ii) an upper region and a lower region between the upper region and the substrate;
wherein (b)(i) the second material is included in both of the upper and lower regions, (b)(ii) the second material in the upper region has fewer defects than the second material in the lower region, and (b)(iii) the first material is lattice-strained in response to the second bulk lattice constant.

6. The device of claim 5 wherein the second material in the upper region is relaxed and is substantially not lattice-strained with respect to the second bulk lattice constant.

7. The device of claim 6 wherein the trench has an aspect ratio (depth to width) of at least 2:1.

8. The device of claim 7, wherein the first material is included within a fin of a fin-based field effect transistor (FinFET).

9. The device of claim 8 wherein:
the first material includes a strained first lattice constant in response to the first material being lattice-strained; and
the strained first lattice constant is unequal to the bulk substrate lattice constant.

10. The device of claim 9 wherein the strained first lattice constant is substantially equal to the second bulk lattice constant.

11. The device of claim 9 wherein the first material includes silicon.

12. The device of claim 9 wherein the first material directly contacts the second material.

13. The device of claim 9 wherein the first material is included within a channel of the FinFET.

14. The device of claim 9 comprising a third portion of the trench including a third material that comprises at least one of a group III-V material, a group IV material, or combinations thereof and has a third bulk lattice constant; wherein the first portion is between the third portion and the substrate.

15. The device of claim 14 wherein the second and third materials each generally have the same chemical composition.

16. The device of claim 15 wherein the third material is relaxed and is substantially not lattice-strained.

17. The device of claim 15 the third material has a third energy bandgap and the first material has a first energy bandgap that is greater than the third energy bandgap.

18. The device of claim 17 wherein:
the dielectric layer has a lower surface between an upper surface of the dielectric layer and the substrate;
the first material has a lower surface between an upper surface of the first material and the substrate;
the upper surface of the dielectric layer is between the upper surface of the first material and the substrate.

19. The device of claim 9 wherein:
the second material has a second energy bandgap and the first material has a first energy bandgap that is less than the second energy bandgap;
the dielectric layer has a lower surface between an upper surface of the dielectric layer and the substrate;
the second material has a lower surface between an upper surface of the second material and the substrate;
the upper surface of the dielectric layer is between the upper surface of the second material and the substrate.

20. The device of claim 9 wherein the first material is undoped.

21. A method comprising:
forming a silicon substrate having a bulk substrate lattice constant;

forming a dielectric layer on the substrate and including a trench;

within a second portion of the trench located between a first portion of the trench and the substrate, forming a second material having a second bulk lattice constant unequal to the bulk substrate lattice constant in upper and lower regions of the second portion;

forming defects within the lower region and relaxing the second material in the upper region;

within the first portion of the trench, forming a first material that comprises at least one of a group III-V material, a group IV material, or combinations thereof and has a first bulk lattice constant;

wherein (a)(i) the second material in the upper region has fewer defects than the second material in the lower region, and (a)(ii) the first material is strained in response to the second bulk lattice constant.

22. The method of claim 21 wherein the first material includes silicon.

* * * * *